United States Patent
Taylor et al.

(10) Patent No.: US 6,923,920 B2
(45) Date of Patent: Aug. 2, 2005

(54) METHOD AND COMPOSITIONS FOR HARDENING PHOTORESIST IN ETCHING PROCESSES

(75) Inventors: Yousun Kim Taylor, Santa Clara, CA (US); Wendy Nguyen, San Jose, CA (US); Chris G. N. Lee, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 181 days.

(21) Appl. No.: 10/219,995

(22) Filed: Aug. 14, 2002

(65) Prior Publication Data

US 2004/0079727 A1 Apr. 29, 2004

(51) Int. Cl.$^7$ ............................................. H01L 21/00
(52) U.S. Cl. ........................................ 216/49; 216/67
(58) Field of Search .................... 216/49, 67; 252/79.1; 251/79.1

(56) References Cited

U.S. PATENT DOCUMENTS

| 5,843,835 | A | 12/1998 | Liu ............................. 438/585 |
| 5,976,769 | A | 11/1999 | Chapman .................... 430/316 |
| 6,103,632 | A | 8/2000 | Kumar et al. ................ 438/717 |
| 6,121,154 | A | 9/2000 | Haselden et al. ........... 438/724 |
| 6,121,155 | A | * 9/2000 | Yang et al. .................. 438/725 |
| 6,299,788 | B1 | 10/2001 | Wu et al. ...................... 216/79 |
| 6,426,300 | B2 | * 7/2002 | Park et al. ................... 438/700 |
| 6,673,498 | B1 | * 1/2004 | Aronowitz et al. ............ 430/5 |
| 2001/0050413 | A1 | 12/2001 | Li et al. ....................... 257/621 |
| 2002/0160320 | A1 | * 10/2002 | Shields et al. .............. 430/328 |

FOREIGN PATENT DOCUMENTS

| JP | 09270420 | 10/1997 | ....... H01L/21/3065 |
| JP | 2001237218 | 8/2001 | ....... H01L/21/3065 |
| WO | 02/080239 A2 | 10/2002 | ......... H01L/21/027 |

OTHER PUBLICATIONS

McGraw–Hill Dictionary of Chemical Terms, Sybil P. Parker Editor in Chief, 1985, pp. 11 and 108.*
Mahorowala et al., "Etching of Polysilicon in Inductively Coupled $Cl_2$ and HBr Discharges", J. Vac. Sci. Technol. B 20(3), May/Jun. 2002, pp. 1055–1063.
Yoneda et al., "Highly Selective AlSiCu Etching Using $BBr_3$ Mixed–Gas Plasma", Japanese Journal of Applied Physics, vol. 29, No. 11, Nov., 1990, pp. 2644–2647.
International Search Report, dated Jan. 13, 2004.

* cited by examiner

*Primary Examiner*—Allan Olsen
(74) *Attorney, Agent, or Firm*—Beyer Weaver & Thomas LLP

(57) ABSTRACT

A method for etching a wafer having a pattern of photoresist material thereon is disclosed. The method includes curing the photoresist material with a bromine containing plasma. Then a main etch of the wafer is carried out. A method for curing a pattern of photoresist material on a wafer is also disclosed. The curing method includes providing a bromine containing plasma and exposing the photoresist material to the plasma, such that a layer of the wafer below the photoresist material is not etched through. A composition of a plasma for curing a photoresist material on a wafer in a high density plasma processing device includes bromine.

13 Claims, 5 Drawing Sheets

METHOD AND COMPOSITIONS FOR HARDENING PHOTORESIST IN ETCHING PROCESSES

FIELD OF THE INVENTION

The present invention relates generally to etching wafers, and more particularly to a method and composition for use in etching wafers used in the production of semiconductor devices.

BACKGROUND OF THE INVENTION

Photolithography is widely used for patterning photoresist material in the production of semiconductor devices. It is desirable to perform photolithography with light of a small wavelength to allow a reduction in the design rule to create smaller semiconductor devices. For example, 193 nm lithography using an Argon Fluoride (ArF) light source may be used to obtain 0.1 µm to 0.07 µm sizes. After a pattern of photoresist material has been provided on a wafer, the exposed layer of the wafer can be etched.

A large number of different chemicals and combinations of chemicals have been used in the past to provide active species in a plasma for etching wafers. There is a complex interplay between the composition of the etchant gas, the material being etched, and the operating conditions of the plasma processing device in which the etching is carried out. Different species of the plasma can be active in providing different effects on the wafer being processed. Hydrogen bromide has been used in the past as an etchant for etching a polysilicon layer in a wafer, with the bromine species in the plasma being active in etching the polysilicon material.

However, etching can have deleterious effects on the fabrication of devices from the wafer. For example, the photoresist material itself can be substantially removed which can expose the area that the photoresist is intended to protect. Also the etchant can cause the photoresist material to deform or twist, which in turn causes the features resulting from etching to be deformed. For example, the intended feature of a straight track could be well defined by photoresist material. However, etching to define the actual track can result in a wavy track actually being formed owing to the twisting and deformation of the photoresist material caused by the etching mechanism. The inability to control the shape of the features being etched can result, in the worst case, in device failure, or at least in non-reproducibility.

In view of the foregoing, it is desirable to be able to use a low wavelength photoresist material for defining features which are well reproduced by an etch process.

SUMMARY OF THE INVENTION

A method for etching a wafer having a pattern of photoresist material thereon is disclosed. The method includes curing the photoresist material with a bromine containing plasma. Then the etching of the wafer is carried out.

A method for curing a pattern of photoresist material on a wafer is also disclosed. The method includes providing a bromine containing plasma. The photoresist material is exposed to the plasma. A layer of the wafer below the photoresist material is not etched through.

A composition of a plasma for curing a photoresist material on a wafer in a high density plasma processing device, including bromine.

A method for etching a wafer having a pattern of photoresist material thereon is also disclosed. The method includes providing an etchant composition. The etchant composition generates a plasma active to etch a layer of the wafer below the photoresist material. A bromine containing plasma is also provided. The bromine containing plasma is active to harden the photoresist material.

A composition for etching a wafer having a pattern of photoresist material thereon is also disclosed. The composition comprises a fluorocarbon or a fluorohydrocarbon and a bromine containing molecule.

BRIEF DESCRIPTION OF THE DRAWINGS

The invention, together with further advantages thereof, may best be understood by reference to the following description taken in conjunction with the accompanying drawings in which.

In the Figures, like reference numerals refer to like components and elements.

DETAILED DESCRIPTION OF THE INVENTION

Figure 1:
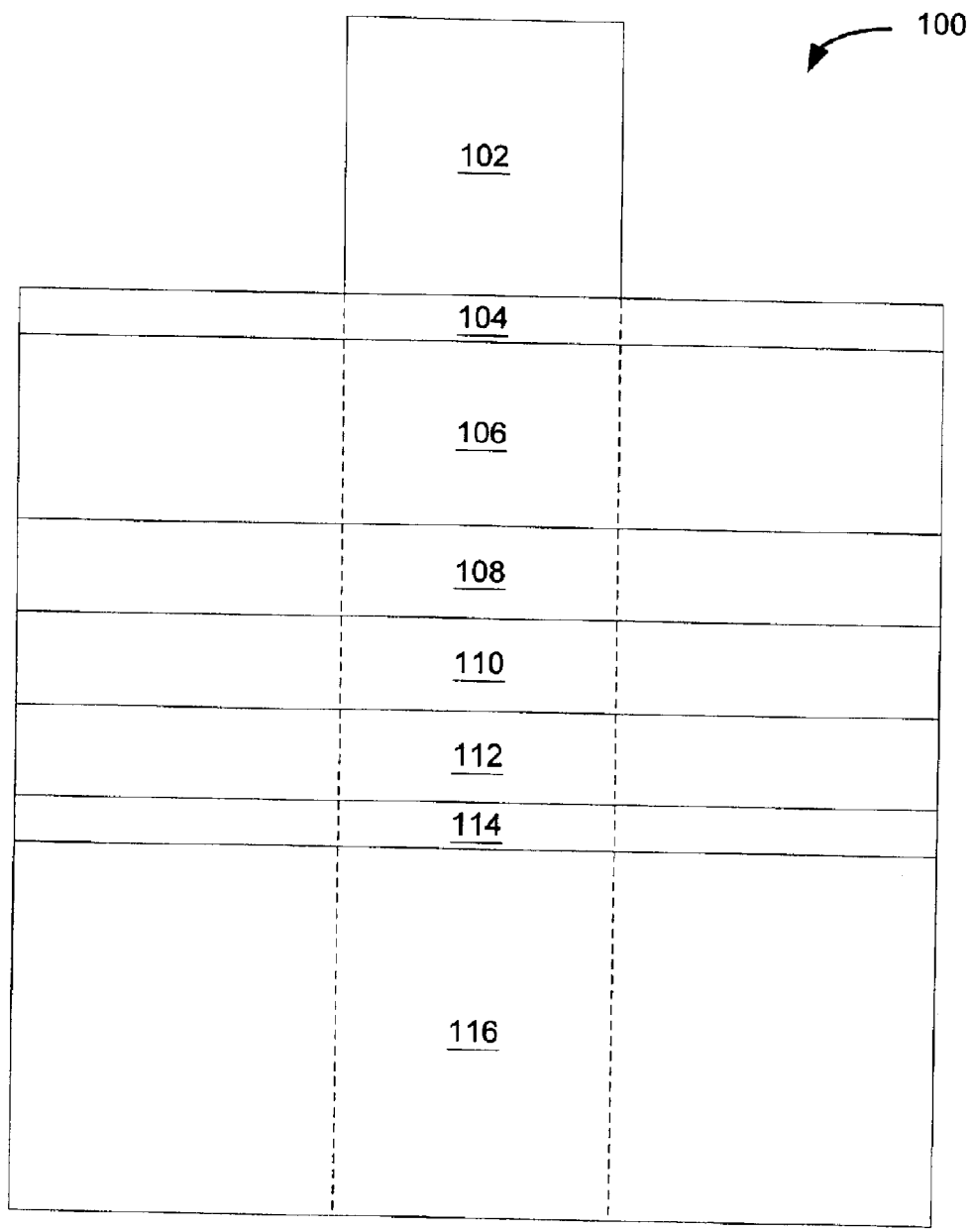
FIG. 1 is a schematic cross sectional view of a wafer on which a method according to the invention can be used.
Figure 2:
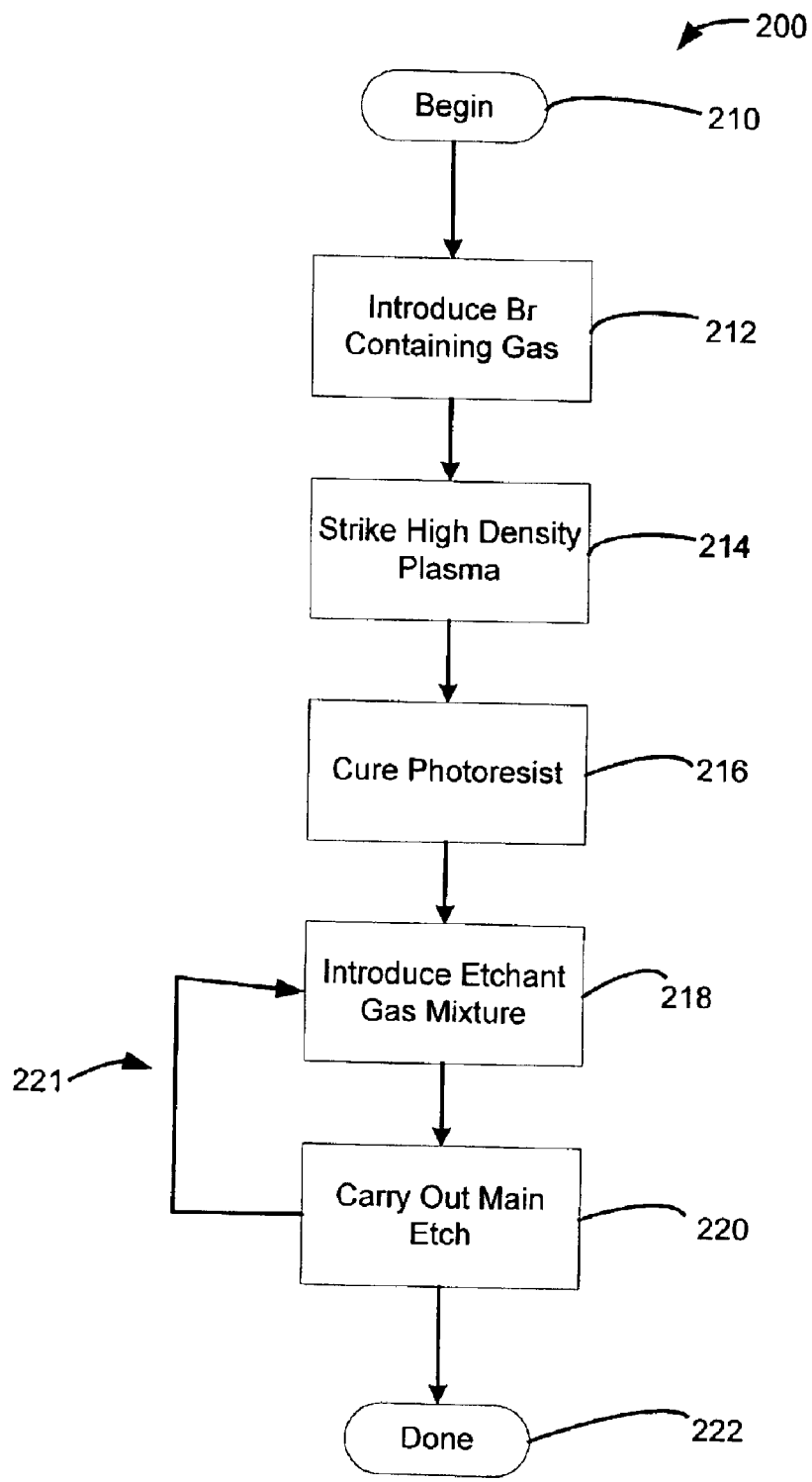
FIG. 2 is a flow chart illustrating the steps of an example of the method of the invention.

An embodiment of the invention will now be described with reference to FIGS. 1 and 2. FIG. 1 shows a schematic cross section through a wafer 100 at a stage during the fabrication of a semiconductor device. A feature to be fabricated in the device is defined by 193 nm photoresist material 102. Herein, 193 nm photoresist material is used to refer to a photoresist material that can be patterned by radiation of wavelength 193 nm. Suitable such materials include alicyclic methacrylate (acrylate) as provided under the trade names PAR 707, PAR 723 and PAR 710 by Sumitomo Corporation. Other suitable 193 nm photoresist materials include cyclic olefin/maleic anhydride (COMA) as provided by JSR Corporation, Shipley Company, LLC and Tokyo Ohka Kogya Co., Ltd., and similar. Photoresist feature 102 is approximately 2600 Å thick. Typically, the thickness of the 193 nm photoresist material layer is between approximately 2200 Å and 3300 Å. Photo imaging processes known in the art may be used to create the photoresist feature, which forms the photoresist mask.

Photoresist feature 102 is above a layer 104 of anti reflection coating ("ARC"), which is typically between approximately 300 and 800 Å thick. The ARC includes bottom antireflective coating (BARC), and is typically a hydrocarbon based material similar to that of the photoresist material. The wafer 100 includes a hardmask layer 106, which may be made of silicon nitride (SiN), which is typically approximately 500 to 2000 Å thick. In the alternative, the hard mask layer may be TEOS (tetra ethyl oxysilicate), silicon oxide, or a composite of the above materials. A layer of tungsten (W) 108 and a layer of tungsten nitride (WN) 110 can optionally be included to improve device speed, followed by a layer 112 of polysilicon material. A thin layer of gate oxide 114 is included, above a silicon substrate 116. Such a wafer substrate is an intermediate product in the fabrication of a EDRAM or DRAM device.

The photoresist material 102 defines a track feature, which is to be propagated onto the wafer as illustrated by dashed lines 118, 120 by etching of the wafer. The feature that the photoresist material is patterned to produce will depend on the design of the chip. Different types of features can be defined by the photoresist material. For example the photoresist material can define a hole or a 'T' or 'U' shaped feature. FIG. 2 shows a flow chart illustrating a method 200 by which the feature can be etched. The method can be carried out using any plasma etching tool or device capable of producing a high density plasma. Suitable tools include the TCP family of plasma processing devices as provided by Lam Research Corporation of Fremont, Calif. The DPS family of tools and similar as provided by Applied Materials, Inc, the SCCM tools provided by Tokyo Electron Limited and the ECR family of tools as provided by Hitachi Ltd are also suitable.

The method 200 is an essentially two step method. In the first step, the photoresist material 102 is hardened and otherwise stabilized without significant etching of the wafer. In a subsequent step, the wafer is actually etched so as to purposefully remove material from layers below and unprotected by the photoresist material. Any material removed by the bromine containing plasma is not intended, or should not be sufficient, to remove an entire layer of the wafer below the photoresist material layer. The main etch step etches the layer of the wafer in which the structural feature being etched is defined.

At the beginning 210 of the method, bromine containing gas is introduced into the plasma processing chamber of the device 212. In this example, the bromine containing gas is hydrogen bromide (HBr). The plasma processing tool is operated under conditions to allow a high density plasma to be struck in the chamber and sustained 214. A high density plasma is considered to be a plasma having a density of greater than approximately $1\times10^{10}$ ions/cm$^3$. The high density plasma can have a density in the range of approximately $1\times10^{10}$ to $1\times10^{13}$ ions/cm$^3$. The photoresist material is exposed to the plasma, and bromine species in the plasma is active to cure the photoresist material 216 so that it is harder and more physically robust. A high density plasma is used in the photoresist curing, pre-main etch step 216, with the plasma processing device operated at a low pressure and high power. The HBr in the curing step does not carry out significant etching of the wafer, but rather strengthens the photoresist material 102. Although hydrogen bromide is the preferred source of bromine species for the plasma, other bromine containing molecules can be used in the curing plasma, such as $SiBr_4$, $CH_3Br$, $Br_2$, $C_2H_5Br$ and higher bromine containing hydrocarbons. Also, although the plasma is preferably purely HBr, additional molecules can be included in the plasma gas mixture, such as inert gases. Preferably, such a mixture for curing would not have significant amounts of active etchants such as hydrocarbons and fluorine containing molecules.

An example of suitable operating conditions for the HBr cure step would be a plasma processing chamber pressure of approximately 5 mT, a power of 1200 W, substantially 0 bias voltage applied to a chuck electrode, a HBr gas flow rate of 100 sccm (standard cubic centimeters per minute) and a cure time of approximately 60 seconds.

It is preferred if substantially no material is removed during the curing step. However, some degree of removal of material from the ARC layer 104 and from the photoresist material 102 can occur during the curing step, prior to the main etch.

Although a zero volt bias potential on the chuck holding the wafer helps to minimize any removal of material, a bias potential of between 0 to 500V can be used, of between 0 to 250V is preferred and of between 0 to 30V is most preferred. Equivalent bias power ranges are approximately 0 to 740 W, 0 to 350 W and 0 to 40 W respectively.

Insubstantial removal of material can also be considered to occur based on the amount of photoresist material that is removed during the curing step. Not more than approximately 600 Å of photoresist material can be lost, preferably not more than approximately 500 Å are lost, more preferably not more than approximately 400 Å are lost and most preferably not more than 300 Å of photoresist material are lost. The proportion of photoresist material lost out of the thickness of photoresist material originally present can be not more than approximately 30%, preferably not more than 12% and more preferably not more than 5%.

Insubstantial removal of material can also be considered to occur based on the amount of the ARC layer material that is removed during the curing step. Not more than 85% of the ARC layer can be removed, preferably not more than 75%, more preferably not more than 70% and most preferably not more than 60%. Substantial etching can be considered to have occurred if etching through the ARC layer occurs during the pre-main etch curing step.

After the curing step 216 has been completed, the HBr plasma is pumped from the plasma chamber and the etchant gas mixture is introduced 218 into the plasma chamber so as to start the main etch of the feature. The composition of the etchant gas mixture is selected so as to effectively etch the intended layer of the wafer. For wafer 100, the next layer to be etched is the ARC layer 104. A suitable etchant gas mixture is $CF_4$ at a flow rate of 40 sccm and He at a flow rate of 120 sccm, although other fluorocarbons providing a source of fluorine for etching the ARC material can be used. In other embodiments, a mixture of HBr and $O_2$ or a mixture of $Cl_2$ and $O_2$ can be used to etch through the ARC layer. The ARC material can be organic or inorganic. Example operating parameters for the plasma etching device are a plasma chamber pressure of 7 mT, TCP power of 600 W, a 100V bias voltage applied to the chuck electrode (equivalent to ~46 W bias power) and an end point of +30% over etch. The ARC layer is etched as part of the main etching step 220, which actually forms the feature defined by the photoresist material.

In another embodiment of the invention, the etch of the ARC layer can be carried out before the curing of the photoresist. The main etch through the layers under and not protected by the photoresist is then carried out after curing of the photoresist.

In another embodiment, a photoresist trimming step can be included in the method. The curing step can then be carried out before the ARC etch and trim steps, or after the ARC etch and trim steps or between the ARC etch and trim steps.

The main etch 220 can include a number of steps in which different etch chemistries and operating parameters are used to etch the different layers of the wafer. Steps 218 and 220 are repeated, as indicated by step 221, for each different main etch step required. The etchant gas composition for the hardmask 106 etch step comprises $CF_4$ at a flow rate of 40 sccm, CH$_2$F$_2$ at a flow rate of 20 sccm and He at a flow rate of 80 sccm. Suitable plasma processing device operating parameters are a pressure of 7 mT, TCP power of 1000 W and chuck bias voltage of 400V (equivalent to a bias power of 300 W). Other gases may be used in the hardmask etching gas composition, including CHF$_3$ in place of CH$_2$F$_2$, and the addition of oxygen and/or NF$_3$.

The tungsten 108, tungsten nitride 110 and other layers can then all be etched as required using etching chemistries that are well known to persons of skill in this art.

Figure 5A:
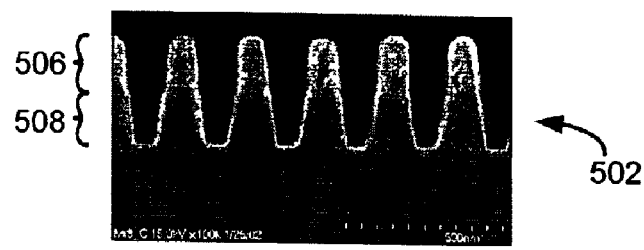
FIGS. 5A, B and C respectively show electron microscope pictures of cross sectional and perspective views of a wafer etched according to the method illustrated in FIG. 2.
Figure 5B:
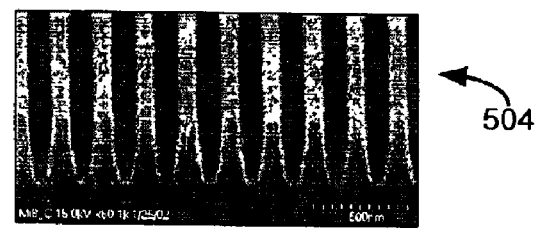
Figure 5C:

It has been found that curing the photoresist material using a bromine containing plasma prior to etching the feature has the effects of reducing the collapse and the twisting of the photoresist material. This results in the feature etched in the wafer being as well defined as the original photoresist material and thereby obviates the problems associated with etching of the feature resulting in deformed features being generated. For example, FIG. 5A shows an electron microscope picture of a cross section 502 through the photoresist and SiN layers of a wafer etched according to the above described method and FIG. 5B shows a perspective view 504. As can be seen a 1400 Å deep layer of photoresist material 506 is present on the SiN hard mask layer 508, and a straight, well defined feature has been etched as shown in FIG. 5C.

Figure 3:
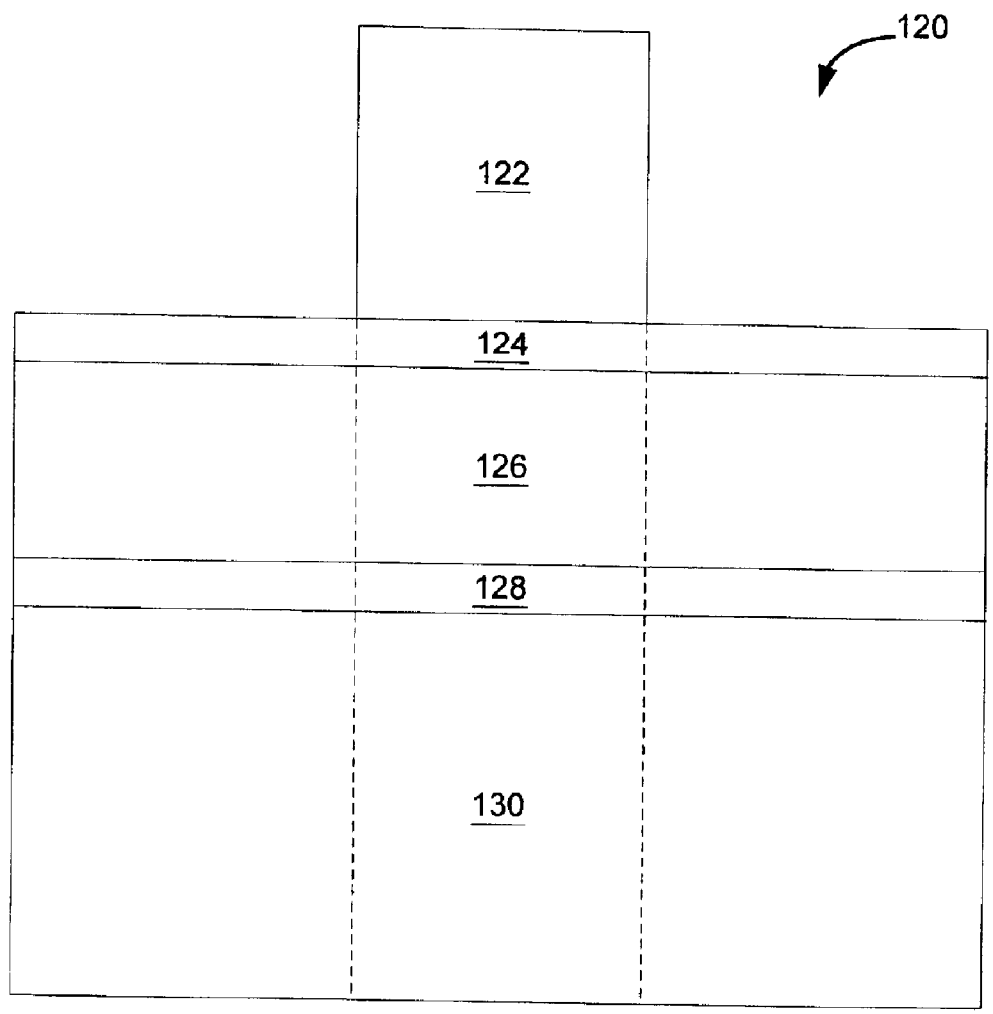
FIG. 3 is a schematic cross sectional view of a wafer on which a method according to the invention can be used.

FIG. 3 shows a cross section through a further wafer 120 illustrating a further embodiment of the invention. The wafer includes a 193 nm photoresist feature 122, which has been patterned on an ARC layer 124. A layer of polysilicon material 126 is present on a thin layer of gate oxide 128 above a silicon substrate 130. This arrangement of layers of a wafer illustrates an intermediate step in the fabrication of many different devices. For example, the intermediate step could be a step in the fabrication of a memory device, a logic device or an eDRAM.

The method of etching is essentially the same as that described previously with reference to FIGS. 2 and 1 except that a different etching chemistry is used during the main etch step for the polysilicon layer 126. The etchant gas composition comprises CF$_4$, chlorine, HBr, oxygen and helium. The etching chemistry for polysilicon is well know to persons of ordinary skill in the art and need not be described further.

Figure 4:
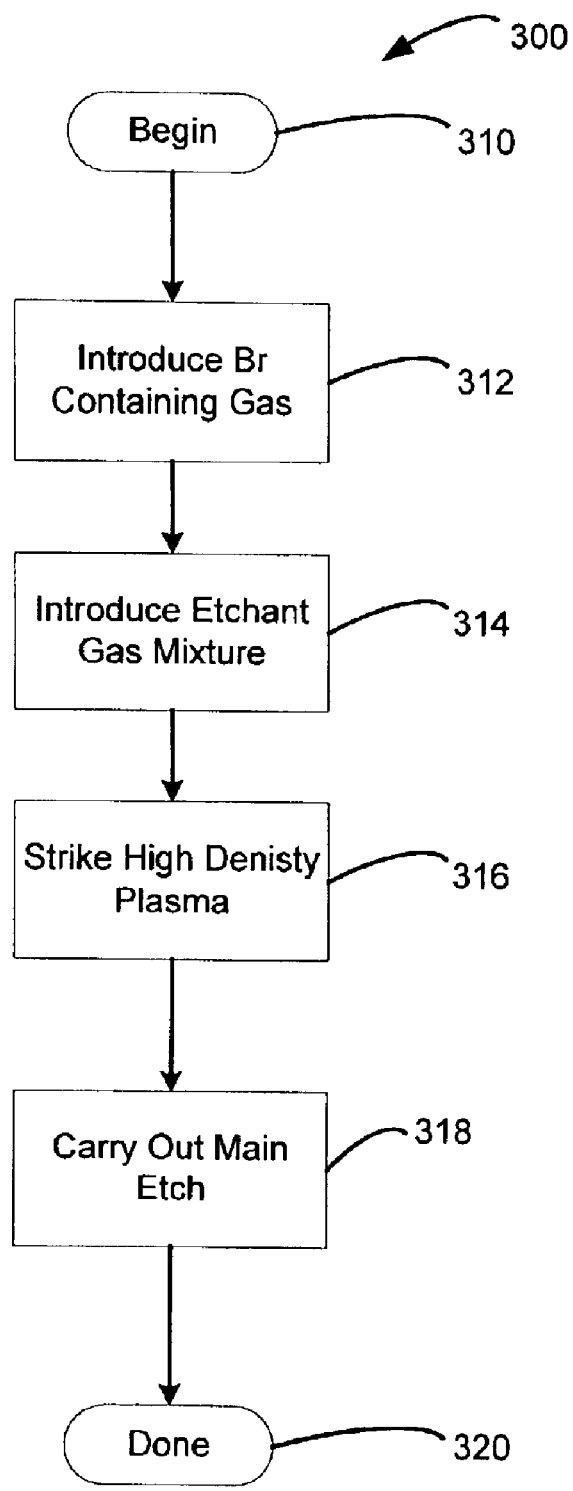
FIG. 4 is a flow chart illustrating the steps of a further example of the method of the invention.

FIG. 4 shows a flow chart illustrating a further embodiment of the method 300 for etching a feature while using HBr to cure the 193 nm photoresist material. The method begins 310 with introducing HBr into a plasma processing device 312. The HBr acts as a source of Br species in the plasma, which is active to cure the photoresist material 122. An etchant gas mixture is also introduced 314 into the plasma processing chamber at the same time as the HBr. The composition of the etchant gas will depend on the wafer layer being etched, but will include at least one source of etchant species, such as fluorine species when CF$_4$ or other fluorocarbons are used as the etchant gas. In other embodiments of the invention, hydrofluorocarbons can be used as the source of etchant species. A high density plasma is then struck and sustained 316 by operating the plasma processing device under low pressure, and high power conditions. The bromine species present in the plasma is active to cure the photoresist material while the fluorine species is active as an etchant to etch away layers of the wafer below the photoresist layer. Hence the etch of the feature can be carried out 318 and the hardening of the photoresist feature prevents its deformation and helps to ensure the propagation of a well defined featured into the wafer. The etch method terminates 320 once the desired end point is reached.

Figure 6A:
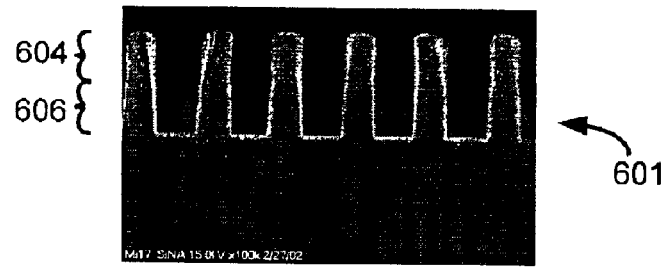
FIGS. 6A, B and C respectively show electron microscope pictures of cross sectional and perspective views of a wafer etched according to the method illustrated in FIG. 4.
Figure 6B:
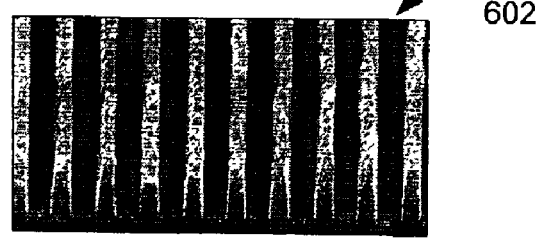
Figure 6C:

FIG. 6A shows an electron microscope picture of a cross section 601 through a wafer like that shown in FIG. 1 after a SiN hardmask layer etch with the addition of HBr. FIG. 6B shows a perspective view along etched trenches 602 and FIG. 6C shows the resulting etch profile 603 for the SiN layer. As can be seen in FIG. 6A the addition of HBr to cure the 193 nm photoresist material results in a significant amount of the photoresist layer material 604 being present after completion of the hardmask etch. As FIG. 6B shows there is a significant absence of any twisting of the photoresist material and well defined, straight lines are etched. There is some tapering of the profile of the SiN layer 606, as shown in FIG. 6C. This method does not provide as good a SiN layer etch profile as the first method 200 described, but is still obviates photoresist deformation and collapse.

The invention has been described above in connection with 193 nm photoresist materials, but the invention can also be used with other deep Ultra Violet (DUV) photoresist materials, including 248 nm.

Other steps can be added to the method of the invention as required in order to fabricate a particular device. However, the step of curing the photoresist material should be either before etching the feature in the underlying layer or concomitant with etching the feature in the underlying layer.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and there full scope of equivalents.

What is claimed is:

1. A method for etching a wafer having a pattern of photoresist material thereon, comprising:

placing the wafer in a plasma etching tool;

curing the photoresist material with a bromine containing plasma, prior to an etch while the wafer is in the plasma etching tool, wherein bromine species in the bromine containing plasma causes the curing of the photoresist material, composing:

providing a bromine containing gas to the plasma etching tool; and generating a plasma within the plasma etching tool, from the bromine containing gas, wherein the density of the plasma from the bromine containing gas is greater than $10^{10}$ ions/cm$^3$ wherein not more than substantially 600 Å of the photoresist material is removed during the curing; and carrying out a main etch of the wafer using the cured photoresist as an etch mask.

2. The method of claim 1, wherein the curing the photoresist material further comprises providing a bias power between 0 to 740 W.

3. The method of claim 1, wherein the curing the photoresist material with the bromine containing plasma does not remove an entire layer of the wafer below the photoresist material layer.

4. The method of claim 1, wherein a bias voltage during the curing is insufficient to etch through an entire layer of the wafer below the photoresist.

5. The method of claim 1, wherein during the curing the photoresist material all gas provided to the etch tool is an essentially pure bromine containing gas.

6. The method of claim 5, wherein the carrying out the main etch uses an etch gas, which is different from the gas provided during the curing the photoresist material.

7. The method of claim 1, wherein the carrying out the main etch uses an etch gas, which is different from the curing gas.

8. The method of claim 1, wherein the plasma formed during the curing the photoresist is formed from a gas consisting essentially of hydrogen bromide.

9. The method of claim 1, wherein the photoresist material is selected from the group comprising: 193 nm photoresist material and 248 nm photoresist material.

10. The method of claim 1, wherein the plasma has a plasma density of less than $1 \times 10^{13}$ ions/cm$^3$.

11. A method for curing a pattern of photoresist material on a wafer comprising:

placing the wafer in a plasma etching tool;

providing a an essentially pure bromine containing gas into the etch tool;

energizing the essentially pure bromine containing gas into a plasma with bromine species and having a density of greater than approximately $1 \times 10^{10}$ ions/cm$^3$; and exposing the photoresist material to the plasma, wherein a layer of the wafer below the photoresist material is not etched through, wherein the exposing the photoresist material cures the photoresist material and wherein the bromine species cause the curing of the photoresist material and wherein not more than substantially 600 Å of the photoresist material is removed during the curing.

12. The method of claim 11, wherein the layer is an ARC layer.

13. A method for etching a wafer having a pattern of photoresist material thereon, comprising:

providing an etchant composition generating a plasma active to etch a layer of the wafer below the photoresist material; and providing a bromine containing plasma active to cure the photoresist material, wherein a high density plasma of greater than $10^{10}$ ions/cm$^3$ is generated and wherein not more than substantially 600 Å of the photoresist material is removed during the curing.

* * * * *